(12) United States Patent  
Horak et al.

(10) Patent No.: US 8,871,624 B2
(45) Date of Patent: Oct. 28, 2014

(54) SEALED AIR GAP FOR SEMICONDUCTOR CHIP

(71) Applicant: International Business Machines Corporation, Armonk, NY (US)

(72) Inventors: David V. Horak, Essex Junction, VT (US); Elbert E. Huang, Carmel, NY (US); Charles W. Koburger, III, Delmar, NY (US); Douglas C. La Tulipe, Jr., Guilderland, NY (US); Shom Ponoth, Gaithersburg, MD (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/742,916

(22) Filed: Jan. 16, 2013

(65) Prior Publication Data

US 2013/0130489 A1    May 23, 2013

Related U.S. Application Data

(62) Division of application No. 12/914,132, filed on Oct. 28, 2010, now Pat. No. 8,390,079.

(51) Int. Cl.
*H01L 29/40* (2006.01)
*H01L 29/49* (2006.01)
*H01L 29/66* (2006.01)
*H01L 21/8234* (2006.01)

(52) U.S. Cl.
CPC .......... *H01L 29/401* (2013.01); *H01L 29/4983* (2013.01); *H01L 29/6653* (2013.01); *H01L 21/823468* (2013.01); *H01L 29/66545* (2013.01)

USPC ............ 438/592; 438/275; 438/584; 438/619

(58) Field of Classification Search
USPC .................................. 438/592, 275, 584, 619
See application file for complete search history.

(56) References Cited

U.S. PATENT DOCUMENTS

| 5,736,446 | A | 4/1998 | Wu |
| 5,770,507 | A | 6/1998 | Chen et al. |
| 5,869,374 | A | 2/1999 | Wu |
| 5,915,182 | A | 6/1999 | Wu |
| 5,959,337 | A | 9/1999 | Gardner et al. |
| 5,972,763 | A | 10/1999 | Chou et al. |
| 6,010,949 | A | 1/2000 | Li et al. |
| 6,015,746 | A | 1/2000 | Yeh et al. |
| 6,054,381 | A | 4/2000 | Okada |
| 6,064,107 | A | 5/2000 | Yeh et al. |

(Continued)

OTHER PUBLICATIONS

Park et al., "Air Spacer MOSFET Technology for 20nm Node and Beyond", ICSICT, 2008, Oct. 20-23, 2008, pp. 53-56.

(Continued)

*Primary Examiner* — Long Pham
(74) *Attorney, Agent, or Firm* — Michael J. Le Strange; Hoffman Warnick LLC

(57) ABSTRACT

A method for forming a sealed air gap for a semiconductor chip including forming a gate over a substrate; forming a sacrificial spacer adjacent to the gate; forming a first dielectric layer about the gate and the sacrificial spacer; forming a contact to the gate; substantially removing the sacrificial spacer, wherein a space is formed between the gate and the first dielectric layer; and forming a sealed air gap in the space by depositing a second dielectric layer over the first dielectric layer.

15 Claims, 14 Drawing Sheets

(56) References Cited

U.S. PATENT DOCUMENTS

| | | | |
|---|---|---|---|
| 6,127,712 | A | 10/2000 | Wu |
| 6,180,988 | B1 | 1/2001 | Wu |
| 6,194,265 | B1 | 2/2001 | Chang et al. |
| 6,258,727 | B1 | 7/2001 | Maccagnan |
| 6,362,073 | B2 | 3/2002 | Kim |
| 6,468,877 | B1 | 10/2002 | Pradeep et al. |
| 6,548,362 | B1 | 4/2003 | Wu |
| 6,878,622 | B1 | 4/2005 | Yang et al. |
| 7,132,342 | B1 | 11/2006 | Sadovnikov et al. |
| 7,179,747 | B2 | 2/2007 | Papa Rao et al. |
| 7,615,427 | B2 | 11/2009 | Lee et al. |
| 7,691,712 | B2 * | 4/2010 | Chidambarrao et al. ..... 438/275 |
| 7,741,663 | B2 | 6/2010 | Hause et al. |
| 2003/0234422 | A1 | 12/2003 | Wang et al. |
| 2004/0110349 | A1 | 6/2004 | King |
| 2004/0140506 | A1 | 7/2004 | Singh et al. |
| 2004/0180536 | A1 | 9/2004 | Fujiwara et al. |
| 2004/0232513 | A1 | 11/2004 | Chi et al. |
| 2006/0017138 | A1 | 1/2006 | Ting |
| 2007/0181950 | A1 | 8/2007 | Miyake et al. |
| 2007/0212839 | A1 | 9/2007 | Chung et al. |
| 2007/0267723 | A1 | 11/2007 | Bernstein et al. |
| 2008/0283937 | A1 | 11/2008 | Shin |
| 2010/0068841 | A1 | 3/2010 | Park et al. |
| 2012/0037962 | A1 | 2/2012 | Breyta et al. |

OTHER PUBLICATIONS

Jeon et al., Effect of HF Treatment on Hydrogenated Silicon Nitride Anti-reflection Films Quality and Optical Properties, IEEE, Copyright 2006, pp. 1425-1428.

Sarah Kate Salerno, USPTO Office Action, U.S. Appl. No. 13/020,107, Notification Date Feb. 21, 2012, 19 pages.

Sarah Kate Salerno, USPTO Final Office Action, U.S. Appl. No. 13/020,107, Notification Date Jun. 15, 2012, 18 pages.

Long Pham, USPTO Office Action, U.S. Appl. No. 12/914,132, Notification date Jun. 26, 2012, 13 pages.

Long Pham, USPTO Notice of Allowance, U.S. Appl. No. 12/914,132, Notification date Oct. 29, 2012, 7 pages.

Long Pham, USPTO Corrected Notice of Allowance, U.S. Appl. No. 12/914,132, Notification date Nov. 14, 2012, 7 pages.

Salerno, Office Action Communication for U.S. Appl. No. 13/020,107 dated Aug. 29, 2013, 21 pages.

Salerno, Office Action Communication for U.S. Appl. No. 13/020,107 dated Jan. 29, 2014, 16 pages.

* cited by examiner

SEALED AIR GAP FOR SEMICONDUCTOR CHIP

CROSS REFERENCE TO RELATED APPLICATION

This application is a divisional application of co-pending U.S. patent application Ser. No. 12/914,132, filed Oct. 28, 2010, which incorporated herein.

BACKGROUND OF THE INVENTION

The present invention relates generally to forming a sealed air gap in semiconductor chips. In particular, the present invention provides a semiconductor chip and method for forming sealed air gaps in semiconductor chips by removing sacrificial spacers adjacent to gates after contact formation.

Semiconductor chips continue to be used in an increasing variety of electronic devices. Simultaneously, the trend in semiconductor chips is to create greater functional capacity with smaller devices. As a result, forming more efficient semiconductor chips requires that the components of semiconductor chips operate more efficiently.

Spacers including silicon nitride formed adjacent to gate sidewalls have a relatively high dielectric constant resulting in gate-to-diffusion and gate-to-contact parasitic capacitances that increase power consumption and reduce performance of semiconductor chips. Spacers including oxide have lower parasitic capacitance but do not stand up well to middle-of-line (MOL) processing. Replacing nitride spacers with oxide results in a lower parasitic capacitance.

Air gaps formed adjacent to gate sidewalls provide the lowest possible dielectric constant with the lowest parasitic capacitance.

BRIEF SUMMARY OF EMBODIMENTS OF THE INVENTION

A first aspect of the invention includes a semiconductor chip, comprising: a substrate; a dielectric layer over the substrate; a gate within the dielectric layer, the gate including a sidewall; a contact contacting a portion of the gate and a portion of the sidewall; and a sealed air gap between the sidewall, the dielectric layer and the contact.

A second aspect of the invention includes a method, comprising: forming a gate over a substrate; forming a sacrificial spacer adjacent to the gate; forming a first dielectric layer about the gate and the sacrificial spacer; forming a contact to the gate; substantially removing the sacrificial spacer, wherein a space is formed between the gate and the first dielectric layer; and forming a sealed air gap in the space by depositing a second dielectric layer over the first dielectric layer.

A third aspect of the invention includes a method, comprising: forming a gate; forming a sacrificial spacer adjacent to a sidewall of the gate; forming a first dielectric layer about the gate and the sacrificial spacer; forming a contact that contacts the gate and a portion of the sidewall of the gate; substantially removing the sacrificial spacer to form a sealed air gap between the gate, the contact and the first dielectric layer; and forming a sealed air gap in the space by depositing a second dielectric layer over the first dielectric layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF EMBODIMENTS OF THE INVENTION

Figure 1:
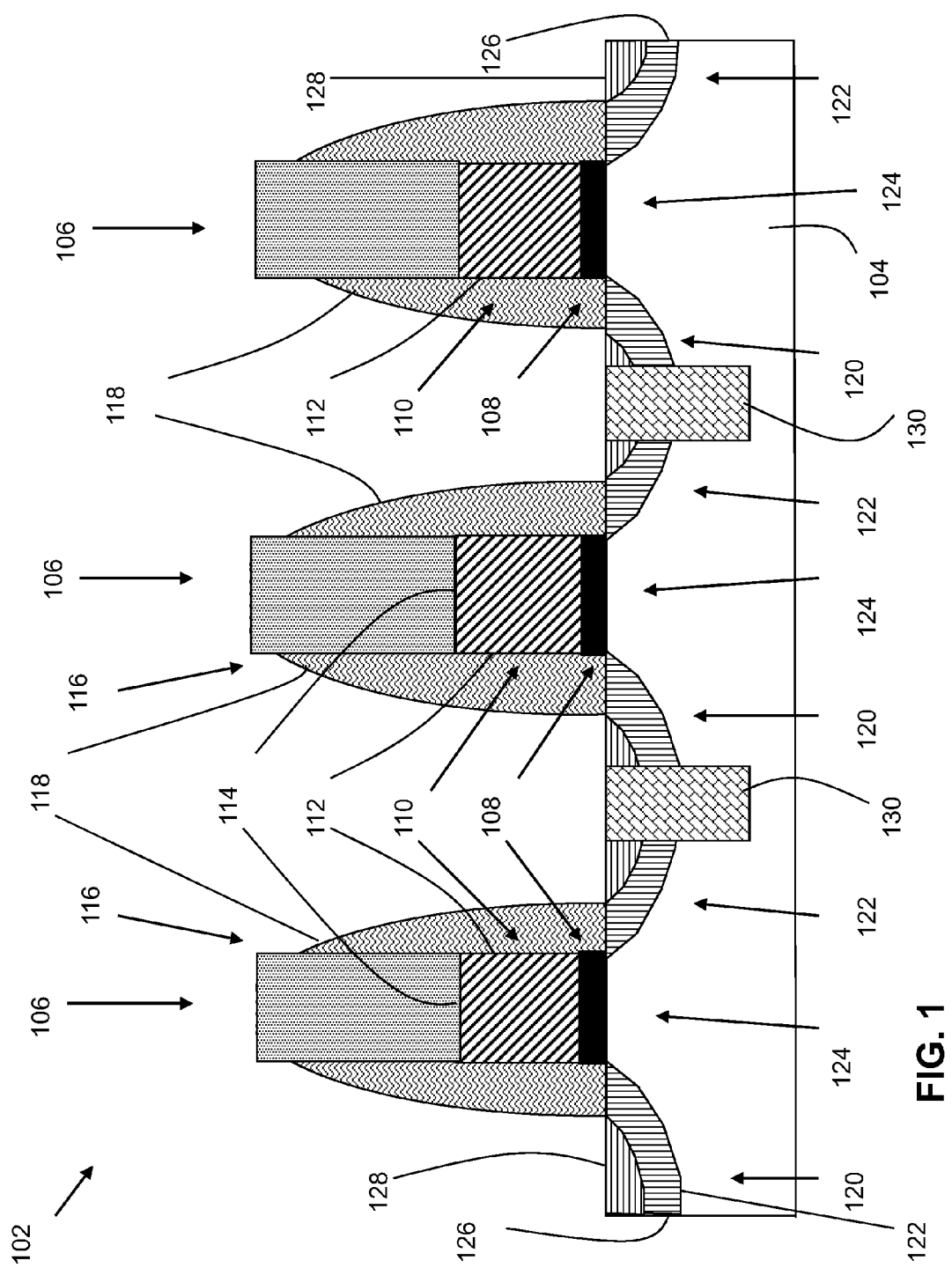
FIG. 1 shows a cross-section view of one embodiment of a step in processing of a semiconductor chip in accordance with this invention.

Referring to FIG. 1, a cross-section view of one embodiment of a step in processing of a semiconductor chip 102 in accordance with this invention is shown. Semiconductor chip 102 includes a substrate 104. A gate 106 may be formed over substrate 104 and may include a gate dielectric 108 over substrate 104 and a gate electrode 110 over gate dielectric 108. Gate dielectric 108 may be comprised of, for example, an oxide and/or a hafnium oxide. Gate 106 may include a sidewall of gate 112 and a top surface of gate 114. Cap 116 may be formed over gate 106 and may include, for example, a nitride and/or an oxide. A spacer 118 may be formed adjacent to gate 106 and cap 116. A source 120 and a drain 122 may be formed in the substrate 104 and a channel 124 may run between source 120 and drain 122 in substrate 104. A person skilled in the art will readily recognize that location of source 120 and drain 122 may be reversed. Each of source 120 and drain 122 include a doped diffusion region 126 and a silicide region 128. A shallow trench isolation 130 may be formed in the substrate 104 to isolate adjacent source 120 of one gate 106 and drain 122 of another gate 106. As understood other structures have been omitted for clarity. The omitted structures may include any conventional interconnect components, passive devices, etc., and additional transistors as employed to make SRAMs, etc.

Substrate 104 may be comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 104 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 104, as illustrated and described, are well known in the art and thus, no further description is necessary.

Figure 2:
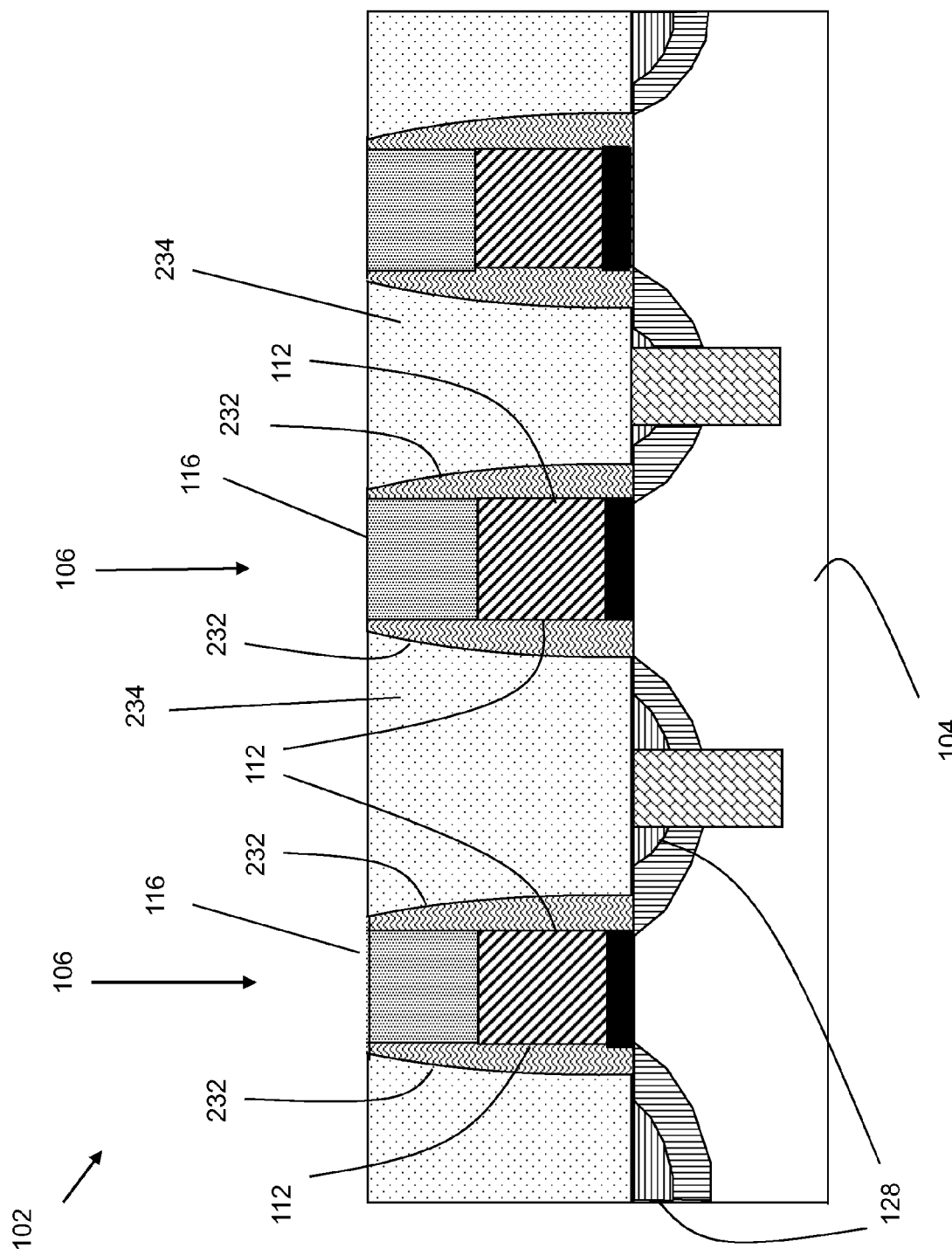
FIG. 2 shows a cross-section view of one embodiment of a next step in processing of semiconductor chip in accordance with this invention.

Referring to FIG. 2, a cross-section view of one embodiment of a next step in processing of semiconductor chip 102 in accordance with this invention is shown. FIG. 2 shows forming a sacrificial spacer 232 adjacent to sidewall of gate 112 and sacrificial spacer 232 may be formed by removing spacer 118 (FIG. 1) and re-forming sacrificial spacer 232, e.g., by depositing a silicon nitride and performing a reactive ion etch (RIE). All or portion of spacer 118 may be used in re-forming sacrificial spacer 232. FIG. 2 also shows forming a first dielectric layer 234 over the substrate 104 about gate 106 and sacrificial spacer 232. As observed by comparing FIGS. 1 and 2, sacrificial spacer 232 may be narrower than spacer 118 (FIG. 1) and may allow first dielectric layer 234 to protect silicide region 128 during subsequent sacrificial spacer 232 removal (see FIGS. 6 and 8). Sacrificial spacer 232 may separate sidewall of gate 112 from first dielectric layer 234. Planarization of first dielectric layer 234 by any known or to be developed method may expose cap 116 and sacrificial spacer 232.

First dielectric layer 234 may include silicon oxide ($SiO_2$), silicon nitride (SiN), or any other suitable material. Any number of dielectric layers may be located over the chip body, as may other layers included in semiconductor chips now known or later developed. In one embodiment, first dielectric layer may include silicon oxide ($SiO_2$) for its insulating, mechanical and optical qualities. First dielectric layer 234 may include but is not limited to: silicon nitride ($Si_3N_4$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available form JSR Corporation, other low dielectric constant (<3.9) material, or layers thereof. First dielectric layer 234 may be deposited using conventional techniques described herein and/or those known in the art.

As used herein, the term "forming" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
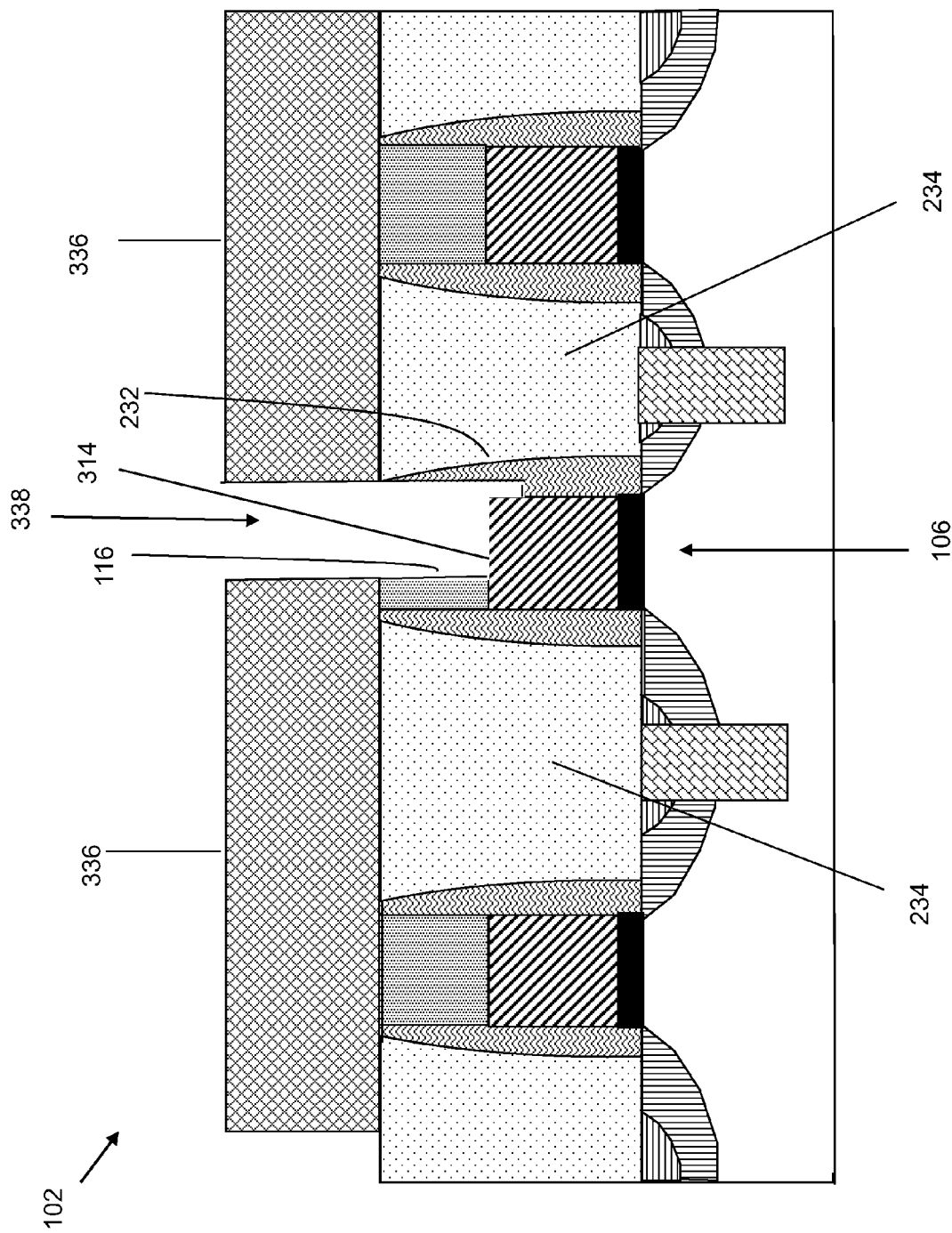
FIG. 3 shows a cross-section view of one embodiment of a next step in processing of semiconductor chip in accordance with this invention.
Figure 4:
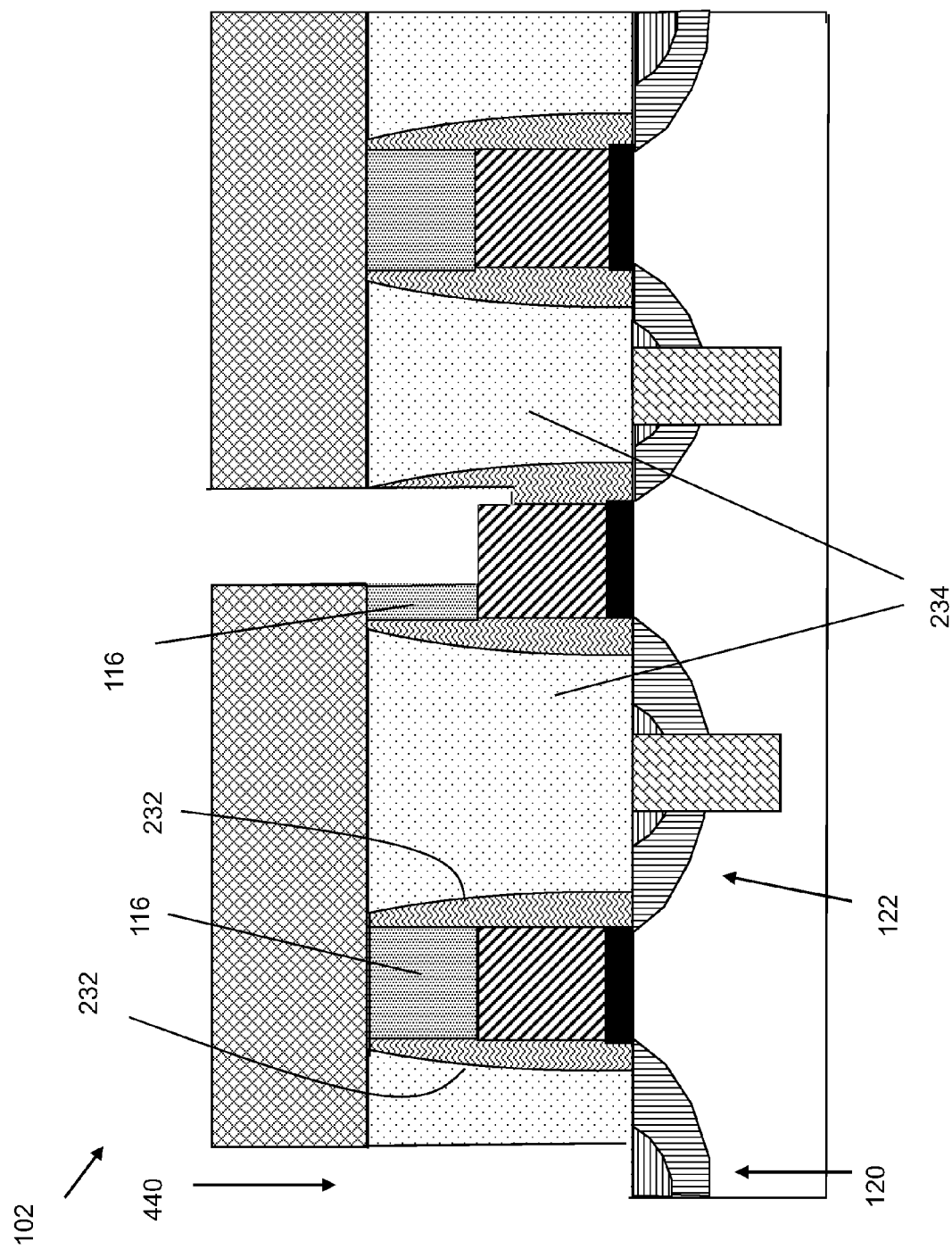
FIG. 4 shows a cross-section view of one embodiment of a next step in processing of semiconductor chip in accordance with this invention.
Figure 5:
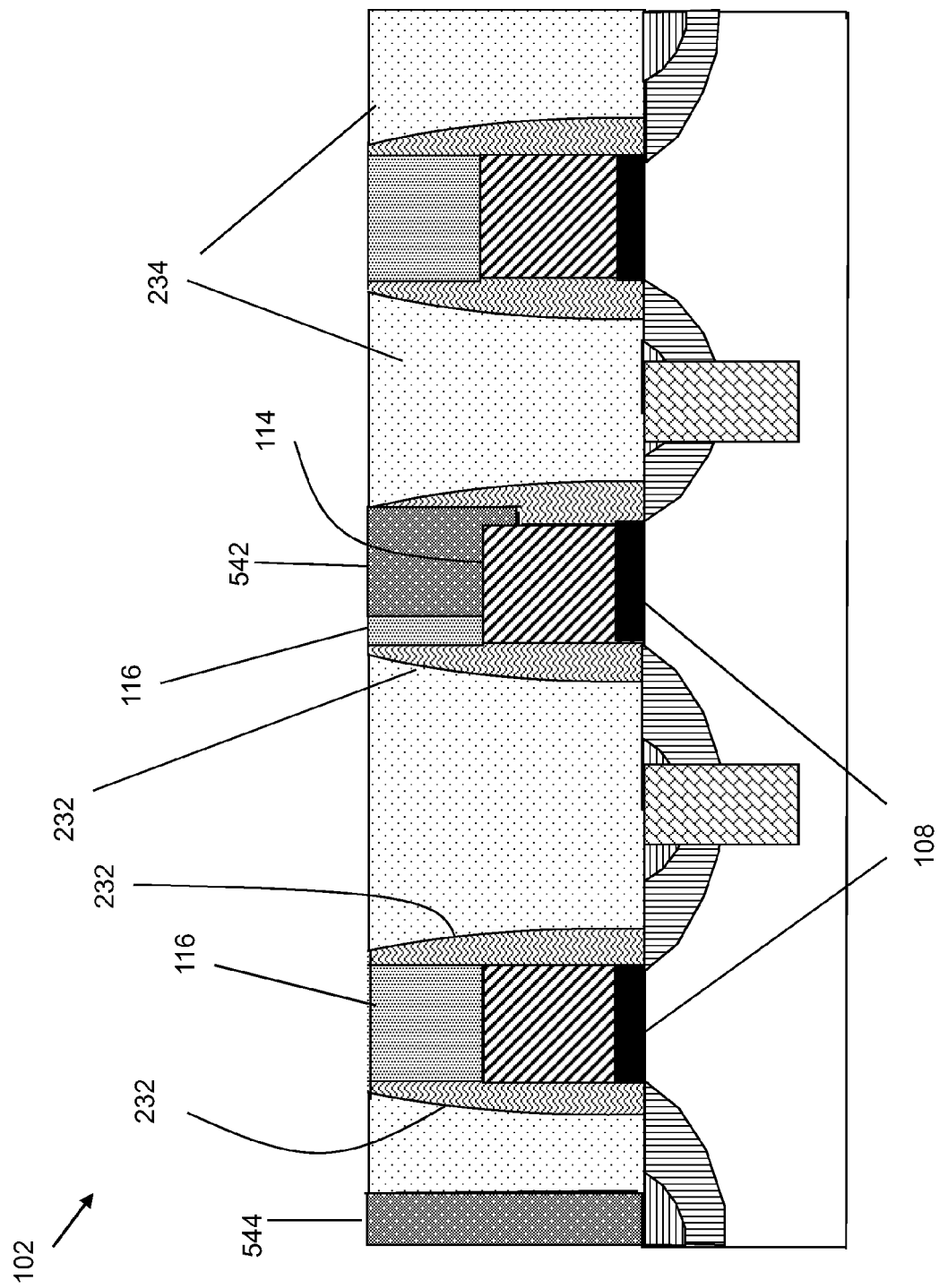
FIG. 5 shows a cross-section view of one embodiment of a next step in processing of semiconductor chip in accordance with this invention.

Referring to FIGS. 3-5, a cross sectional view of one embodiment of forming a contact to gate 106 is illustrated. In FIG. 3, a mask 336 may be formed over first dielectric layer 234. Forming mask 336 may include photoresist technique or any other known or to be developed techniques. A first etching through cap 116 may form a first contact channel 338 to gate 106. First etching may also include etching through a portion of sacrificial spacer 232. A portion of cap 116 may remain. First contact channel 338 may expose a portion of top surface of gate 314. First etching may include a chemical selective to photoresist.

In FIG. 4, a second etching through first dielectric layer 234 may form a second contact channel 440 to source 120 or drain 122. Second etching may be selective to cap 116 and sacrificial spacer 232.

In FIG. 5, mask 336 (FIG. 3) may be removed using any known or to be developed technique. A first contact 542 may be formed in first contact channel 338 (FIG. 3). A second contact 544 may be formed in second contact channel 440 (FIG. 4). First contact 542 and second contact 544 may include at least one of copper and tungsten. First contact 542 may contact a portion of top surface of gate 114 and sidewall of gate 112.

Figure 6:
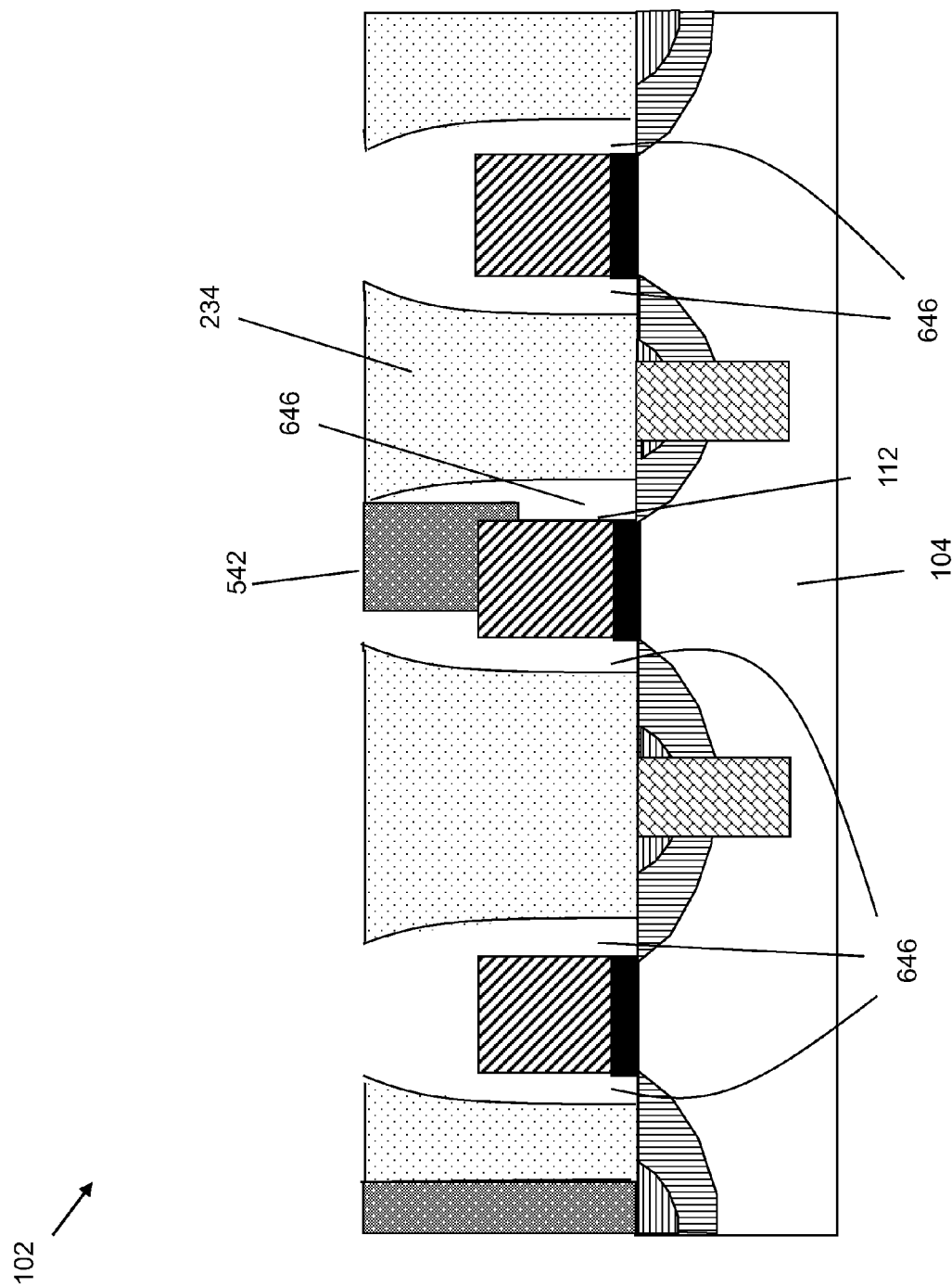
FIG. 6 shows a cross-section view of one embodiment of a next step in processing of semiconductor chip in accordance with this invention.

Referring to FIG. 6, substantially removing sacrificial spacer 232 (FIG. 4) and cap 116 (FIG. 4) and exposing an air gap 646 between sidewall of gate 112 and first dielectric layer 234 is illustrated. Air gap 646 over substrate 104 may be formed between sidewall of gate 112 and first dielectric layer 234 and first contact 542.

Referring again to FIG. 5, substantially removing sacrificial spacer 232 and cap 116 may include using a hot phosphorous wet etch. Hot phosphorous wet etch may be used when gate dielectric 108 includes an oxide, cap 116 includes a nitride, sacrificial spacer 232 includes nitride and first dielectric layer 234 includes silicon oxide or low k film containing Si, C, O, and H (also known as carbon-doped oxide (CDO)). Alternatively, hot phosphorous wet etch may be used when gate dielectric 108 includes hafnium oxide, cap 116 includes nitride, sacrificial spacer 232 includes hydrogen nitride ($SiN_xH_y$, silicon nitride having a high Si—N—H bond content) and first dielectric layer 234 includes CDO. Alternatively, substantially removing sacrificial spacer 232 and cap 116 may include using a buffered hydrofluoric acid wet etch. Buffered hydrofluoric acid wet etch may be used when gate dielectric 108 includes hafnium oxide, cap 116 includes oxide, sacrificial spacer 232 includes oxide and first dielectric layer 234 includes CDO. Alternatively, buffered hydrofluoric acid wet etch may be used when gate dielectric 108 includes hafnium oxide, cap 116 includes nitride, sacrificial spacer 232 includes oxide and first dielectric layer 234 includes CDO.

Figure 7:
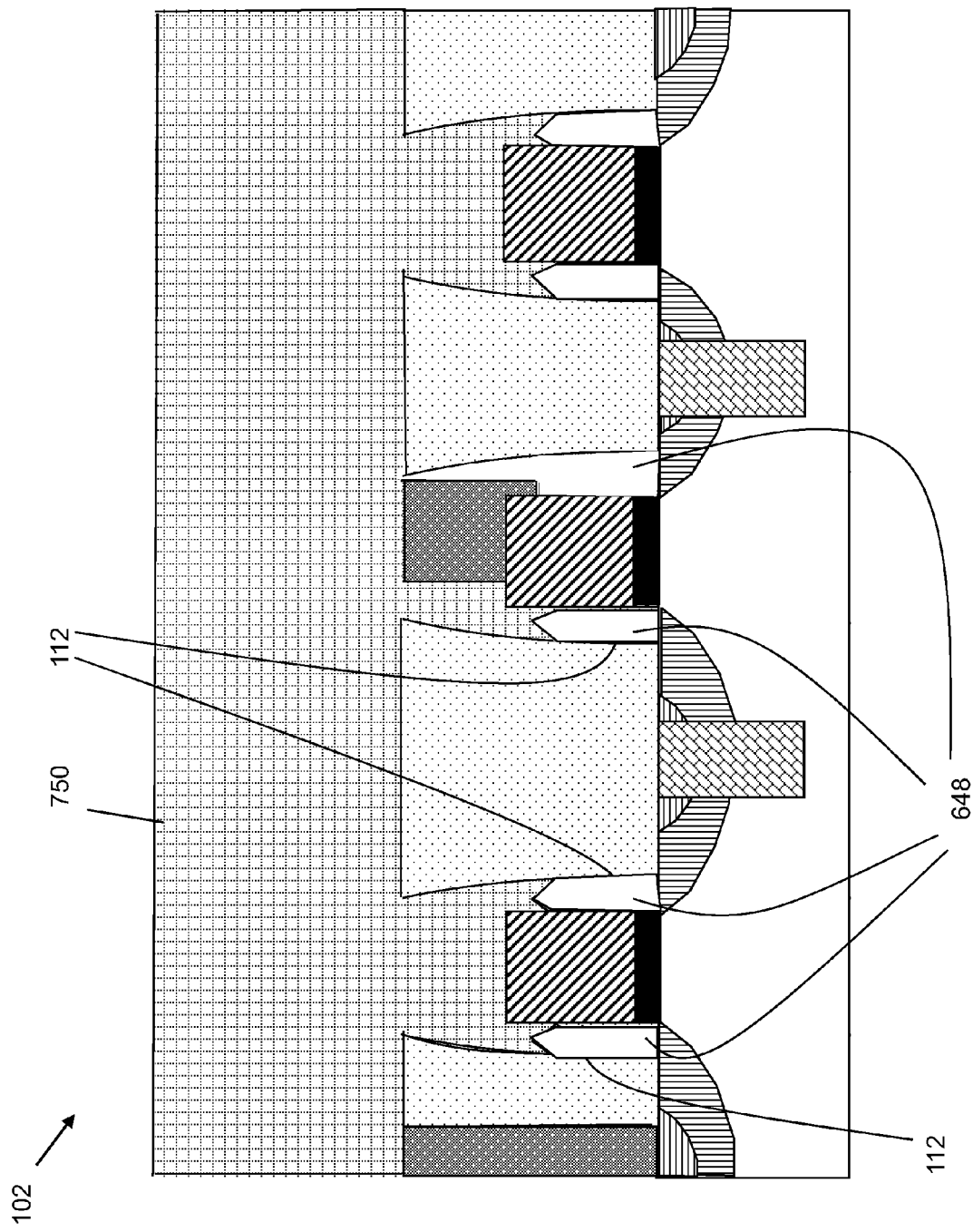
FIG. 7 shows a cross-section view of one embodiment of a next step in processing of semiconductor chip in accordance with this invention.

Referring to FIG. 7, forming sealed air gap 648 in the space by depositing a second dielectric layer 750 over first dielectric layer 234 is illustrated. Second dielectric layer 750 may partially fill air gap 646 (FIG. 6) and may create sealed air gap 648 adjacent to sidewall of gate 112.

Figure 8:
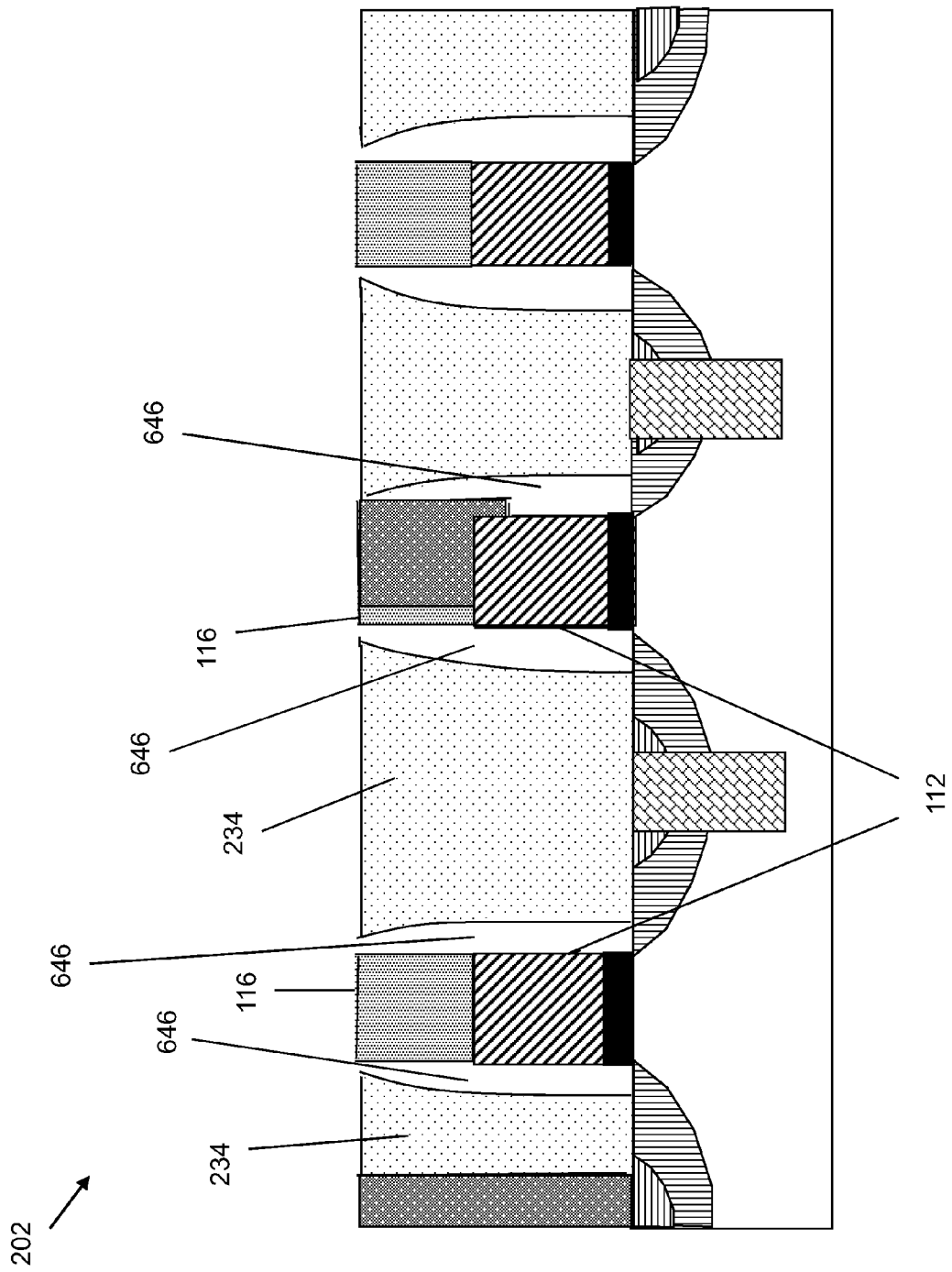
FIG. 8 shows a cross-section view of one alternative embodiment of a step in processing of a semiconductor chip in accordance with this invention.

Referring to FIG. 8, a cross sectional view of one alternative embodiment of a step in forming a semiconductor chip 202 in accordance with this invention is shown. As applied to FIG. 6, sacrificial spacer 232 (FIG. 5) may be removed and cap 116 may remain intact exposing air gap 646 between sidewall of gate 112 and first dielectric layer 234. This process may include using buffered hydrofluoric acid wet etch. Buffered hydrofluoric acid wet etch may be used when gate dielectric 108 includes hafnium oxide, cap 116 includes nitride, sacrificial spacer 232 includes hydrogen nitride and first dielectric layer 234 includes CDO.

Figure 9:
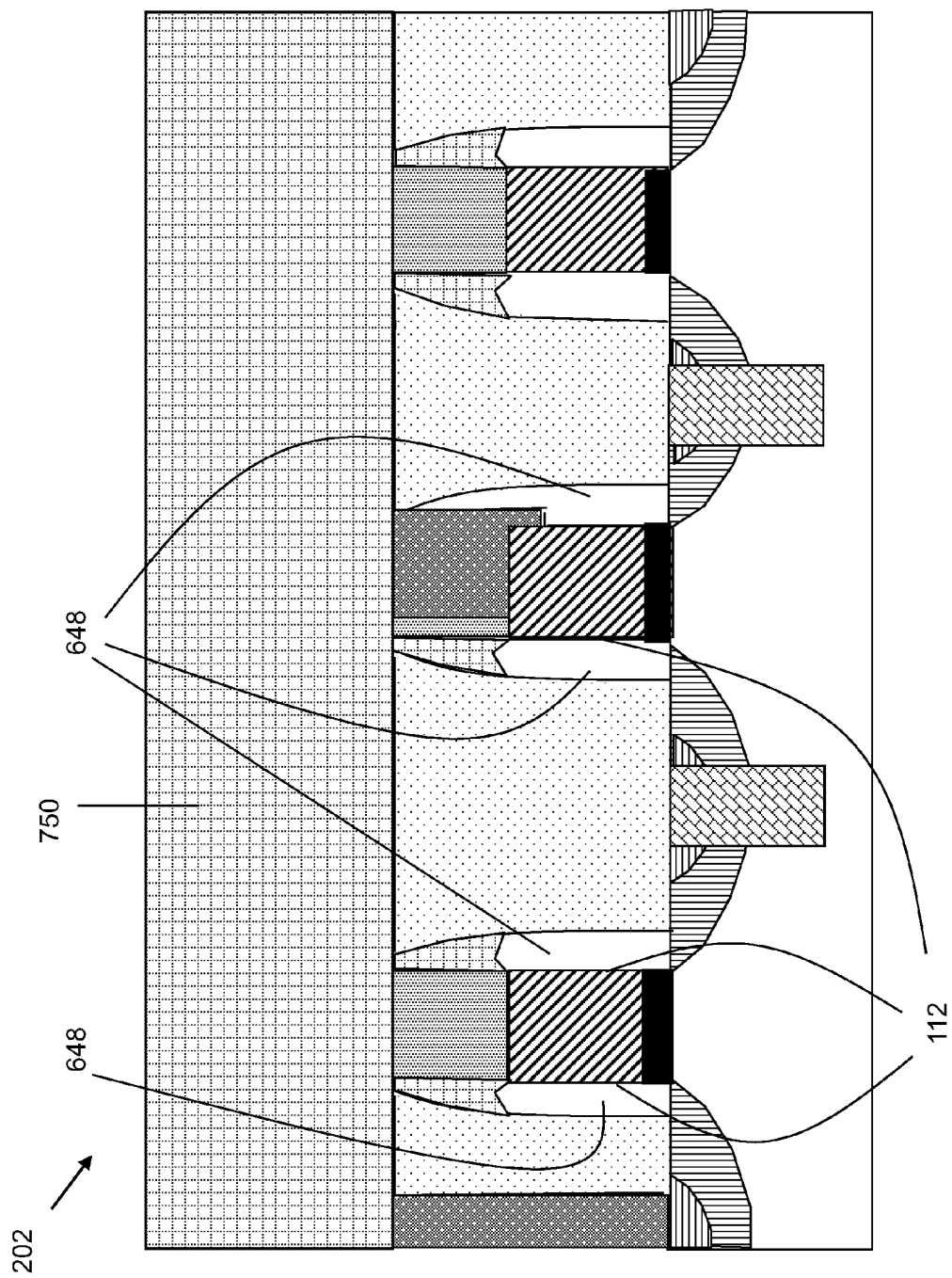
FIG. 9 shows a cross-section view of one embodiment of a next step in processing of semiconductor chip in accordance with this invention.

Referring to FIG. 9, a cross-section view of the alternative embodiment of FIG. 8 removing sacrificial spacer 232 with cap 116 remaining intact is illustrated. Second dielectric layer 750 may partially fill air gap 646 (FIG. 8) and may create sealed air gap 648 adjacent to sidewall of gate 112.

Figure 10:
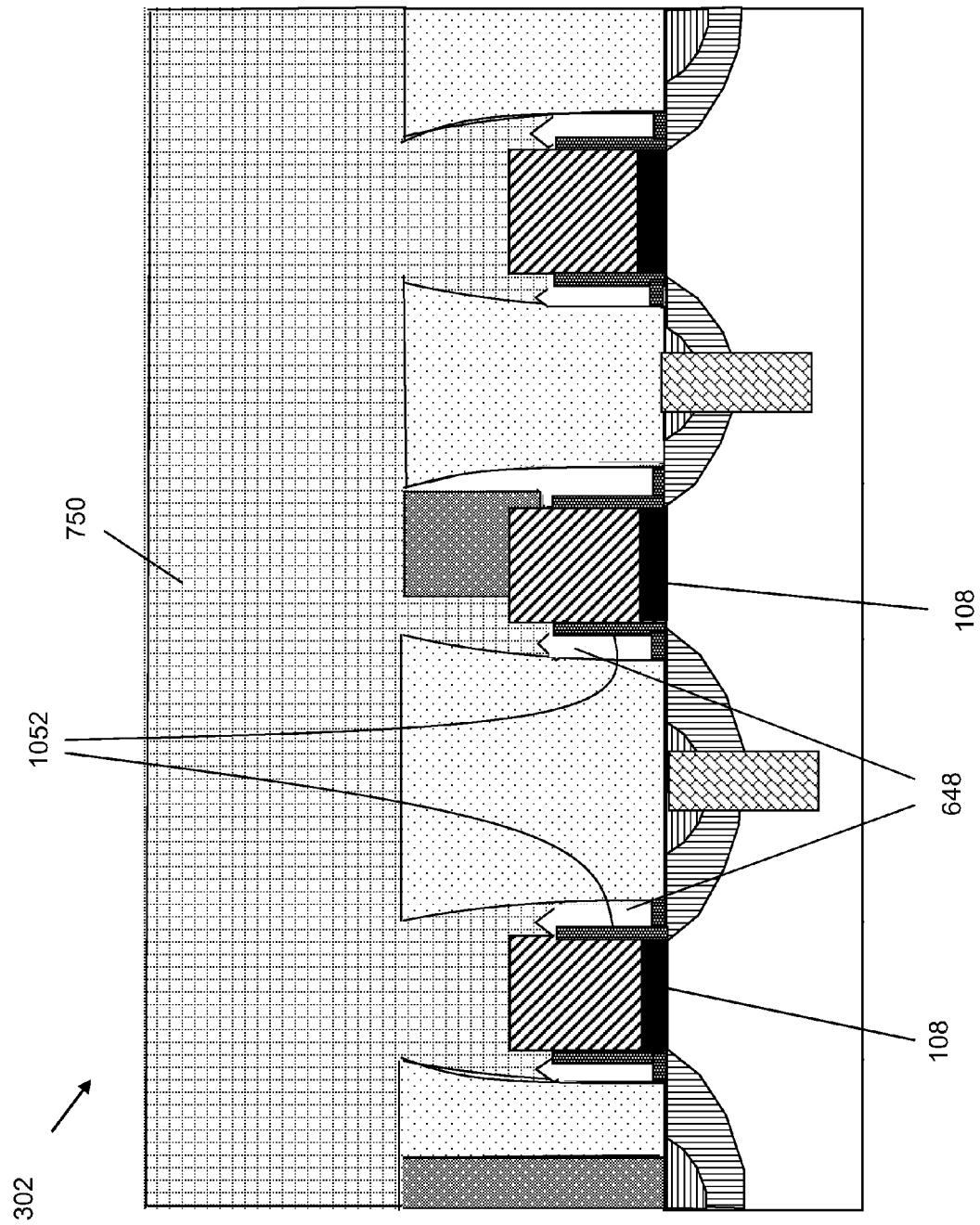
FIG. 10 shows a cross-section view of one alternative embodiment of a step in processing of a semiconductor chip in accordance with this invention.

Referring to FIG. 10, a cross sectional view of one alternative embodiment of a step in forming a semiconductor chip 302 in accordance with this invention is shown. As applied to FIGS. 2-6, a dielectric oxygen diffusion barrier 1052 may be formed substantially over gate dielectric 108 prior to forming sacrificial spacer 232 (FIG. 2). Dielectric oxygen diffusion barrier 1052 may substantially prevent oxygen from diffusing into gate dielectric 108 during removal of sacrificial spacer 1032 when using buffered hydrogen fluoride wet etch. Dielectric oxygen diffusion barrier 1052 may remain in sealed air gap 648 after forming second dielectric layer 750.

Figure 11:
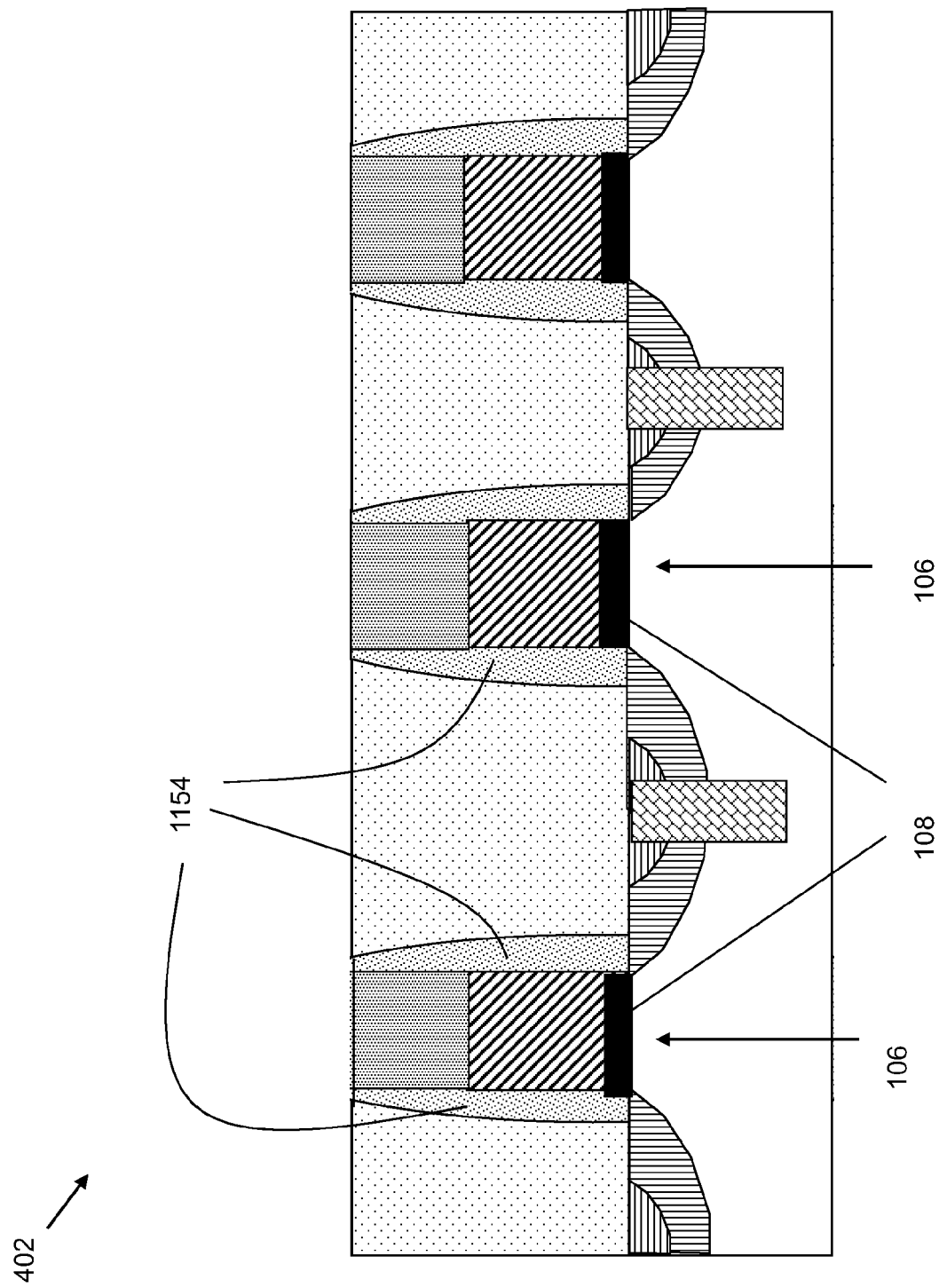
FIG. 11 shows a cross-section view of one alternative embodiment of a step in processing of a semiconductor chip in accordance with this invention.

Turning to FIGS. 11-14 in one alternative embodiment as applied to FIG. 2. FIG. 11 shows, prior to forming sacrificial spacer 232 (FIG. 2), a protective spacer 1154 may be formed adjacent to gate 106 and substantially over gate dielectric 108.

Figure 12:
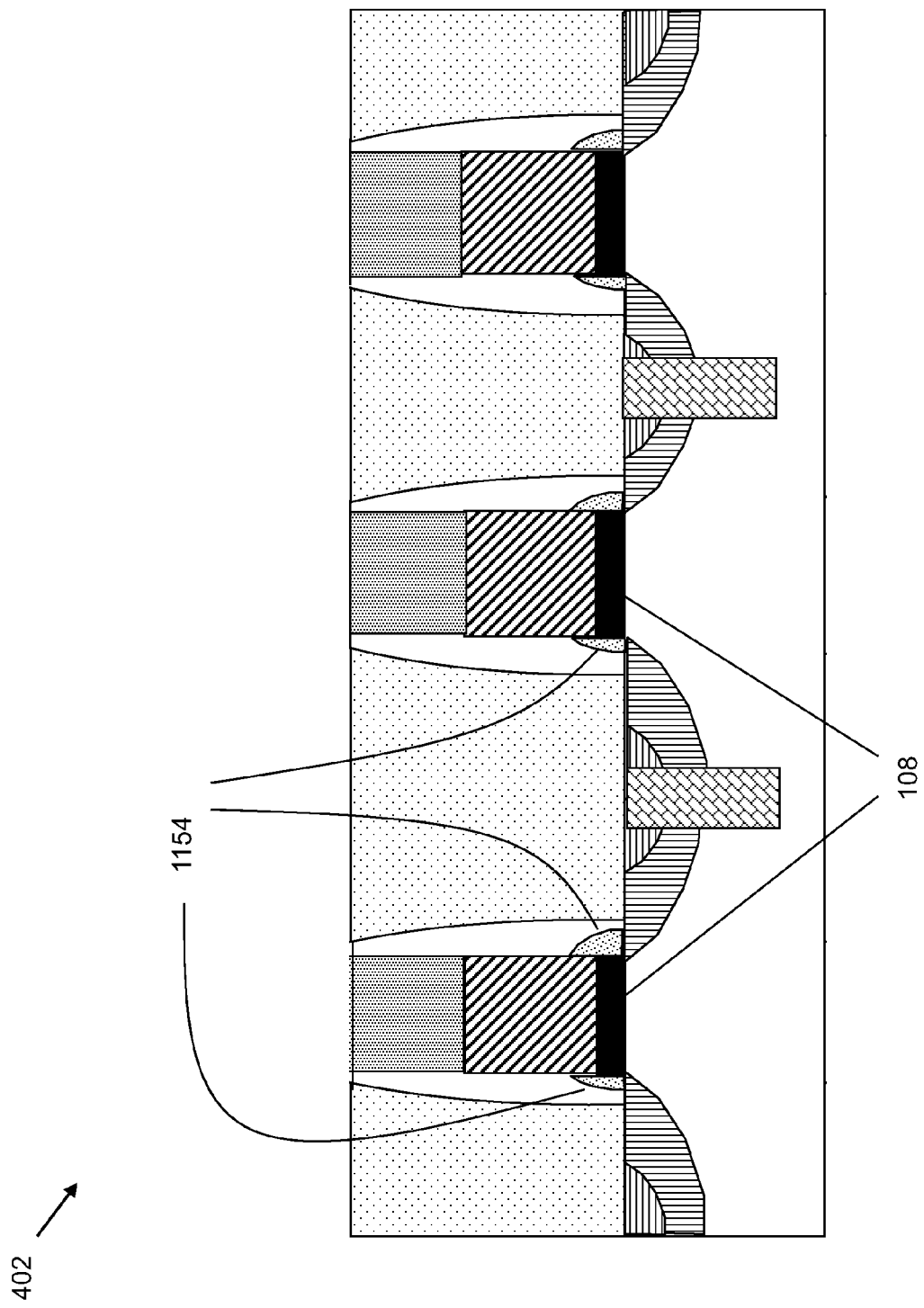
FIG. 12 shows a cross-section view of one embodiment of a next step in processing of semiconductor chip in accordance with this invention.

FIG. 12 shows a portion of protective spacer 1154 removed, leaving a portion of protective spacer 1154 substantially over gate dielectric 108. Protective spacer 1154 may substantially prevent oxygen from diffusing into gate dielectric 108 during removal of sacrificial spacer 232 (FIG. 5) when using buffered hydrogen fluoride wet etch.

Figure 13:
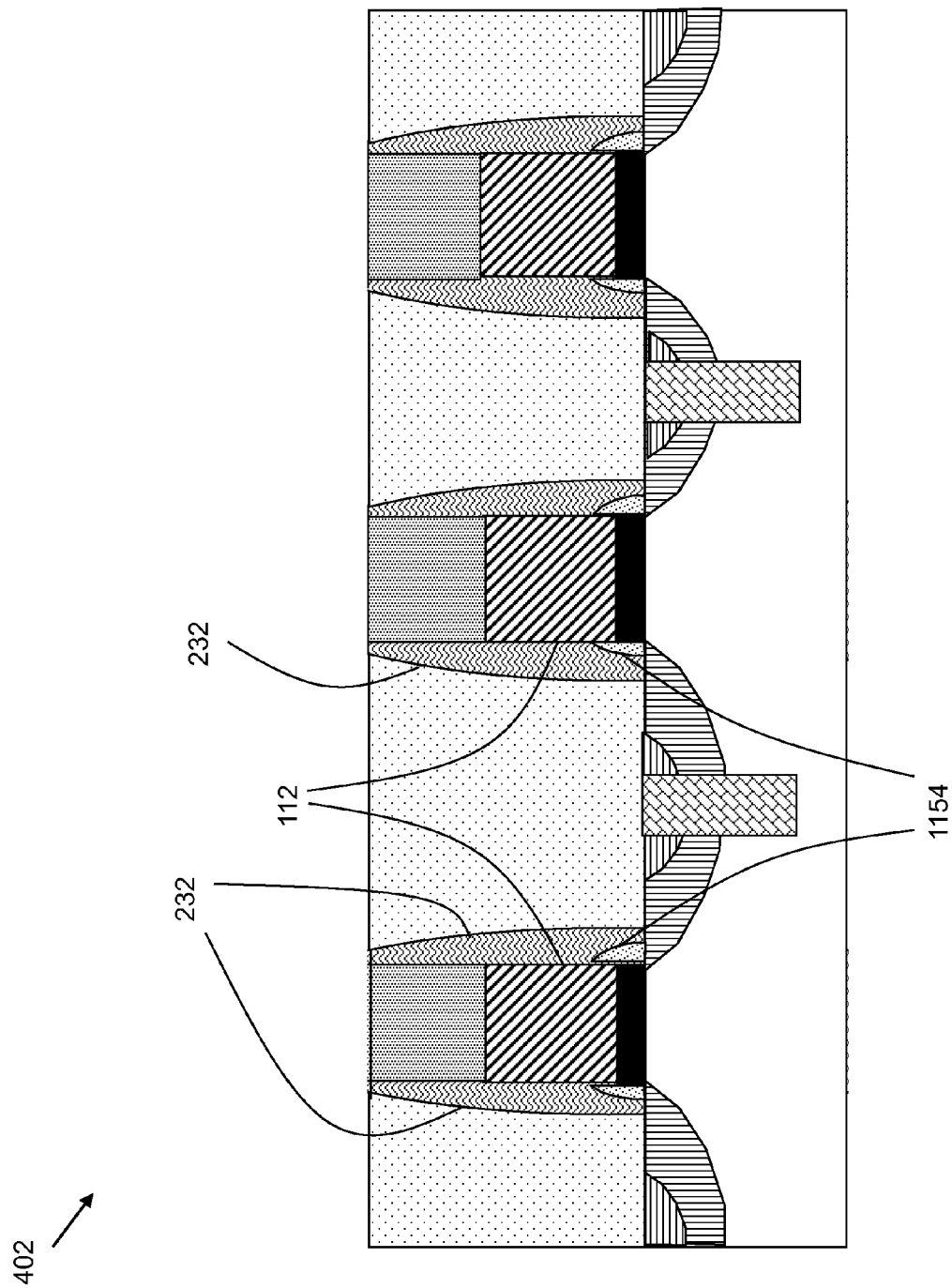
FIG. 13 shows a cross-section view of one embodiment of a next step in processing of semiconductor chip in accordance with this invention.
Figure 14:
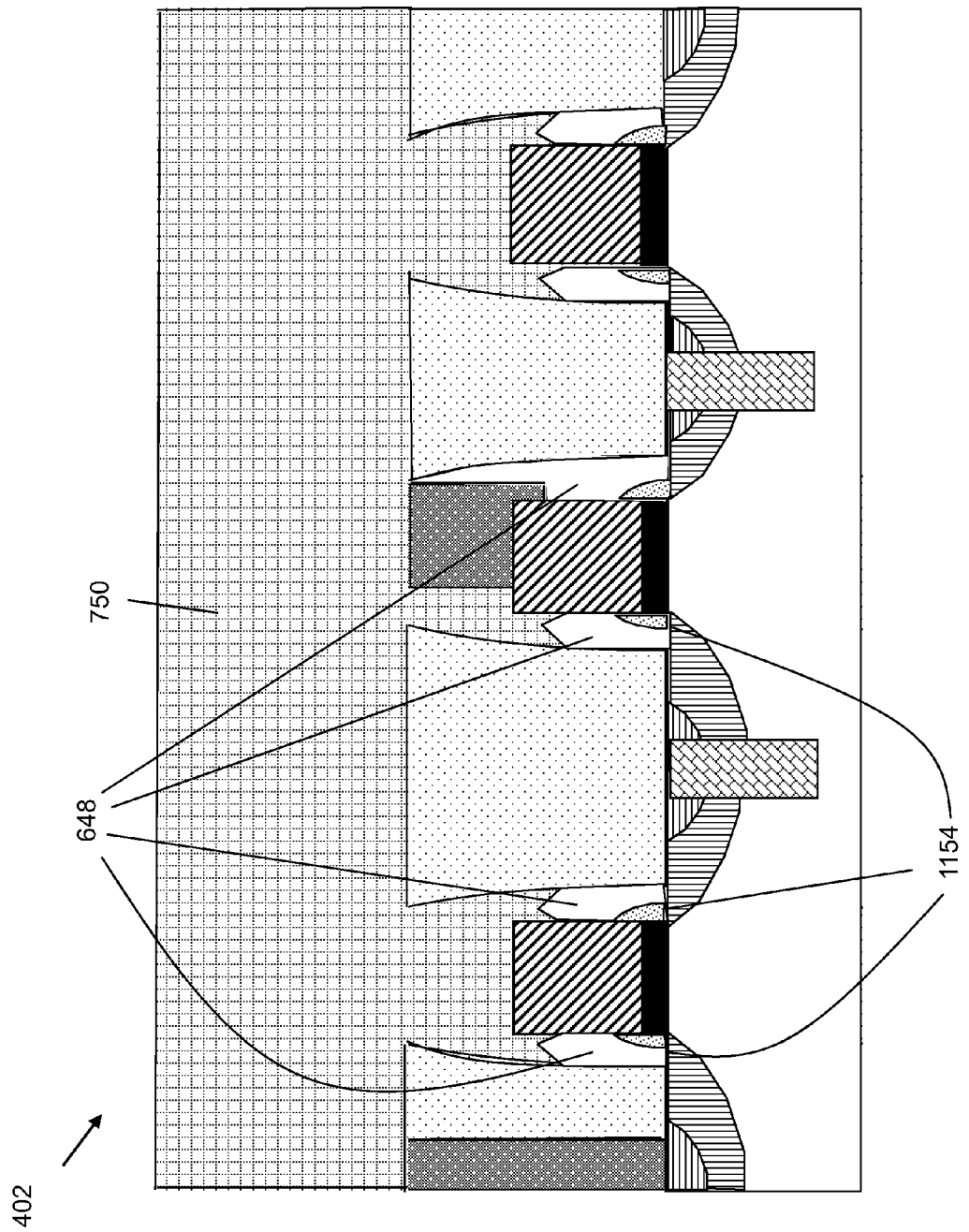
FIG. 14 shows a cross-section view of one embodiment of a next step in processing of semiconductor chip in accordance with this invention.

FIG. 13 shows a sacrificial spacer 232 may be formed over protective spacer 1154 and adjacent to sidewall of gate 112. As shown in FIG. 14 protective spacer 1154 may remain in sealed air gap 648 after forming second dielectric layer 750.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method, comprising:
    forming a gate over a substrate;
    forming a cap directly over the gate;
    forming a sacrificial spacer adjacent to the gate;
    forming a first dielectric layer about the gate and the sacrificial spacer;
    forming a contact channel through the first dielectric layer, a first portion of the sacrificial spacer, and a second portion of the cap;
    forming a contact in the contact channel to the gate;
    substantially removing the sacrificial spacer, wherein a space is formed between the gate and the first dielectric layer; and
    forming a sealed air gap in the space by depositing a second dielectric layer over the first dielectric layer.

2. The method of claim 1, wherein the gate includes a gate dielectric; and
    further comprising: forming a dielectric oxygen diffusion barrier substantially over the gate dielectric and a source and a drain in the substrate and prior to the sacrificial spacer forming.

3. The method of claim 1, wherein the gate includes a gate dielectric; and
    further comprising prior to the sacrificial spacer forming:
        forming a protective spacer adjacent to the gate and over the gate dielectric;
    removing a portion of the protective spacer; and
    wherein the sacrificial spacer is positioned adjacent to the gate and over the protective spacer.

4. The method of claim 1, wherein the contact forming includes positioning the contact to a portion of a top surface of the gate and a sidewall of the gate.

5. The method of claim 4, wherein the contact comprises at least one of copper and tungsten.

6. The method of claim 1, further comprising:
    forming a cap over the gate, the gate including a gate dielectric,
    wherein the gate dielectric includes an oxide, the cap includes a nitride, the sacrificial spacer includes a nitride and the dielectric layer includes a carbon-doped oxide, and
    wherein the substantially removing the sacrificial spacer includes using a hot phosphorous wet etch.

7. The method of claim 1, further comprising:
    forming a cap over the gate, the gate including a gate dielectric,
    wherein the gate dielectric includes a hafnium oxide, the cap includes an oxide, the sacrificial spacer includes an oxide and the dielectric layer includes a carbon-doped oxide, and
    wherein the substantially removing the sacrificial spacer includes using a buffered hydrofluoric acid wet etch.

8. The method of claim 1, further comprising:
forming a cap over the gate, the gate including a gate dielectric,
wherein the gate dielectric includes a hafnium oxide, the cap includes an oxide, the sacrificial spacer includes a hydrogen nitride and the dielectric layer includes a carbon-doped oxide, and
wherein the substantially removing the sacrificial spacer includes using a buffered hydrofluoric acid wet etch.

9. The method of claim 1, further comprising:
forming a cap over the gate, the gate including a gate dielectric,
wherein the gate dielectric includes a hafnium oxide, the cap includes an nitride, the sacrificial spacer includes a hydrogen nitride and the dielectric layer includes a carbon-doped oxide, and
wherein the substantially removing the sacrificial spacer includes using a buffered hydrofluoric acid wet etch.

10. The method of claim 1, further comprising:
forming a cap over the gate, the gate including a gate dielectric,
wherein the gate dielectric includes a hafnium oxide, the cap includes a nitride, the sacrificial spacer includes a hydrogen nitride and the dielectric layer includes a carbon-doped oxide, and
wherein the substantially removing the sacrificial spacer includes using a hot phosphorous wet etch.

11. A method, comprising:
forming a gate;
forming a cap directly over the gate;
forming a sacrificial spacer adjacent to a sidewall of the gate;
forming a first dielectric layer about the gate and the sacrificial spacer;
forming a contact channel through the first dielectric layer, a first portion of the sacrificial spacer, and a second portion of the cap;
forming a contact in the contact channel that contacts the gate and a third portion of the sidewall of the gate;
substantially removing the sacrificial spacer to form a sealed air gap between the gate, the contact and the first dielectric layer; and
forming a sealed air gap in the space by depositing a second dielectric layer over the first dielectric layer.

12. The method of claim 11, wherein the gate includes a gate electrode and a gate dielectric.

13. The method of claim 12, further comprising: forming a dielectric oxygen diffusion barrier substantially over the gate dielectric prior to sacrificial spacer forming.

14. The method of claim 12, further comprising prior to the sacrificial spacer forming:
forming a protective spacer adjacent to the gate and over the gate dielectric;
removing a portion of the protective spacer; and
wherein the sacrificial spacer is positioned adjacent to the gate and over the protective spacer.

15. The method of claim 11, wherein the contact comprises at least one of copper and tungsten.

\* \* \* \* \*